(12) United States Patent
Shah et al.

(10) Patent No.: US 11,676,924 B2
(45) Date of Patent: Jun. 13, 2023

(54) SEMICONDUCTOR CHIP WITH REDUCED PITCH CONDUCTIVE PILLARS

(71) Applicant: ADVANCED MICRO DEVICES, INC., Santa Clara, CA (US)

(72) Inventors: Priyal Shah, Santa Clara, CA (US); Milind S. Bhagavat, Broomfield, CO (US); Lei Fu, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/195,046

(22) Filed: Mar. 8, 2021

(65) Prior Publication Data

US 2021/0193604 A1 Jun. 24, 2021

Related U.S. Application Data

(63) Continuation of application No. 16/414,389, filed on May 16, 2019, now Pat. No. 10,943,880.

(51) Int. Cl.
*H01L 23/00* (2006.01)

(52) U.S. Cl.
CPC .............. *H01L 24/13* (2013.01); *H01L 24/11* (2013.01); *H01L 2224/10145* (2013.01); *H01L 2224/1145* (2013.01); *H01L 2224/11462* (2013.01); *H01L 2224/11849* (2013.01); *H01L 2224/13007* (2013.01); *H01L 2224/13014* (2013.01); *H01L 2224/13026* (2013.01); *H01L 2224/13084* (2013.01); *H01L 2224/13111* (2013.01); *H01L 2224/13139* (2013.01);
(Continued)

(58) Field of Classification Search
CPC ..................... H01L 24/13; H01L 24/11; H01L 2224/10145; H01L 2224/1145; H01L 2224/11462; H01L 2224/11849; H01L 2224/13007; H01L 2224/13014; H01L 2224/13026; H01L 2224/13084; H01L 2224/13111; H01L 2224/13139; H01L 2224/13144; H01L 2224/13147; H01L 2224/03912; H01L 2224/0401; H01L 2224/1147; H01L 2224/13017; H01L 2224/13018; H01L 24/16
See application file for complete search history.

(56) References Cited

U.S. PATENT DOCUMENTS 6,639,299 B2  10/2003  Aoki
6,897,664 B1  5/2005  Bruce et al.
(Continued)

OTHER PUBLICATIONS

Citralogam, http://www.citralogam.com/diagramsnballoyphase. html, Dec. 18, 2012, 2 pages.
(Continued)

*Primary Examiner* — Douglas W Owens

(57) ABSTRACT

Various semiconductor chips and packages are disclosed. In one aspect, an apparatus is provided that includes a semiconductor chip that has a side, and plural conductive pillars on the side. Each of the conductive pillars includes a pillar portion that has an exposed shoulder facing away from the semiconductor chip. The shoulder provides a wetting surface to attract melted solder. The pillar portion has a first lateral dimension at the shoulder. A solder cap is positioned on the pillar portion. The solder cap has a second lateral dimension smaller than the first lateral dimension.

20 Claims, 12 Drawing Sheets

(52) U.S. Cl.
CPC .......... *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13169* (2013.01); *H01L 2224/13172* (2013.01); *H01L 2224/13181* (2013.01); *H01L 2224/13184* (2013.01); *H01L 2924/014* (2013.01); *H01L 2924/381* (2013.01)

(56) References Cited

U.S. PATENT DOCUMENTS

| | | | |
|---|---|---|---|
| 7,198,980 | B2 | 4/2007 | Jiang et al. |
| 7,772,104 | B2 | 8/2010 | Pham et al. |
| 7,884,633 | B2 | 2/2011 | Potok et al. |
| 7,888,176 | B2 | 2/2011 | Wong et al. |
| 7,977,157 | B2 | 7/2011 | Fee et al. |
| 8,394,672 | B2 | 3/2013 | Su et al. |
| 8,472,190 | B2 | 6/2013 | Refai-Ahmed et al. |
| 8,704,353 | B2 | 4/2014 | Su et al. |
| 8,759,962 | B2 | 6/2014 | Su |
| 9,318,464 | B2 | 4/2016 | Eppes |
| 9,324,667 | B2 | 4/2016 | Uehling et al. |
| 10,453,817 | B1* | 10/2019 | Dadvand ............... B23K 26/34 |
| 10,943,880 | B2* | 3/2021 | Shah ...................... H01L 24/13 |
| 11,233,036 | B2* | 1/2022 | Chandolu ............... H01L 25/18 |
| 2005/0167798 | A1 | 8/2005 | Doan |
| 2007/0176297 | A1 | 8/2007 | Zohni |
| 2009/0289360 | A1 | 11/2009 | Takahashi et al. |
| 2012/0193788 | A1 | 8/2012 | Fu et al. |
| 2012/0241949 | A1* | 9/2012 | Sasaki .................... H01L 24/03 228/256 |
| 2014/0183723 | A1 | 7/2014 | Ayotte et al. |
| 2015/0069605 | A1* | 3/2015 | Lin ........................ H01L 24/13 257/737 |
| 2016/0086905 | A1* | 3/2016 | Aleksov ................ H01L 24/14 257/737 |
| 2016/0322322 | A1* | 11/2016 | Utsunomiya ......... H01L 24/13 |
| 2016/0351520 | A1 | 12/2016 | Jiang |
| 2017/0288108 | A1 | 10/2017 | Schumann et al. |
| 2017/0358545 | A1* | 12/2017 | Choi ..................... H01L 24/13 |
| 2017/0358554 | A1 | 12/2017 | Chen et al. |
| 2018/0218991 | A1* | 8/2018 | Farooq .................. H01L 24/11 |
| 2020/0303334 | A1* | 9/2020 | Liu ........................ H01L 24/17 |
| 2020/0365543 | A1 | 11/2020 | Shah et al. |
| 2021/0175193 | A1* | 6/2021 | Yamamoto ............. H01L 24/14 |

OTHER PUBLICATIONS

Falk, "Advanced LIVA/TIVA Techniques", Proceedings from the 27th International Symposium for Testing and Failure Analysis, Nov. 11-15, 2001, 7 pages, ASM International, Cleveland, OH.

Keigler et al. "Copper Deposition For Pillars and Vias", Semiconductor Manufacturing Magazine, vol. 7, Issue 8, Aug. 2006, 6 pages, Shanghai, China.

\* cited by examiner

SEMICONDUCTOR CHIP WITH REDUCED PITCH CONDUCTIVE PILLARS

BACKGROUND OF THE INVENTION

Many current integrated circuits are formed as multiple dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

Some conventional packages used solder bumps to connect to mounted semiconductor chips. Others utilize conductive pillars. Conventional conductive pillars are typically uniform diameter metal cylinders capped with a solder cap. The chip is placed on a conventional package with the solder caps in close proximity to conductor structures of the package, which are typically pre-solders, and a reflow is performed to temporarily liquefy the solder caps. A cool down follows to solidify the solder joints between the metal cylinders and the conductors of the package.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
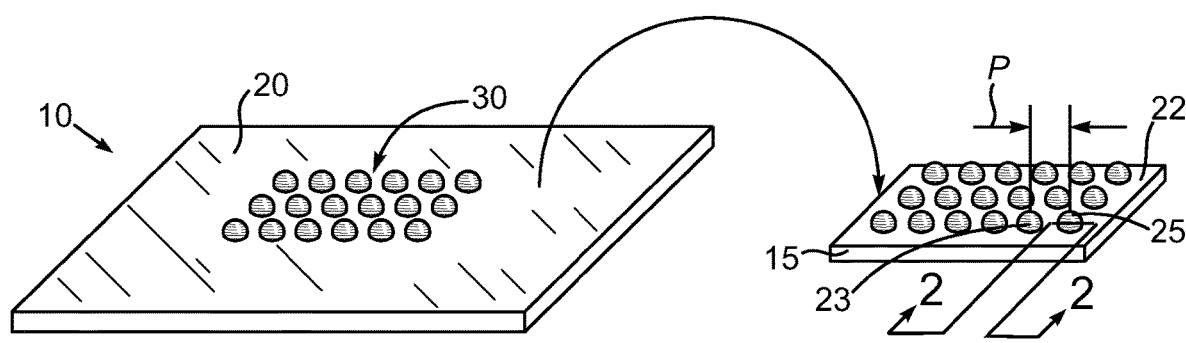
FIG. 1 is a pictorial view of an exemplary arrangement of a semiconductor chip device with a semiconductor chip exploded from a circuit board.

As noted in the Background section hereof, a conventional conductive pillar arrangement includes plural uniform diameter cylindrical metal pillars capped with solder caps. When such chips are mounted on package substrates, forces are imposed by the conventional pillars on underlying layers of a semiconductor chip during thermal cycling and other times. Such stresses tend to be greater for conventional copper pillars than for both lead free solder caps and comparable lead based solder caps, and greater for lead free solder caps than comparable lead based solder caps. The level of stresses imposed by the conventional uniform diameter pillars are a function of the pillar area and thus the pillar diameter. One technical challenge for modern semiconductor chips is that beneath the pillars are positioned various dielectric layers that are used to reduce parasitic capacitance and improved electrical performance. These typically low-K and extremely low-K materials tend to be rather brittle and thus care must be taken to avoid imposing excessive stresses from the conductive pillars into these buried dielectric layers.

It is desirable to continually strive for greater packing density in terms of conductive pillars. Larger numbers of conductive pillars can provide for greater data throughput and additional flexibility in the bump patterns of semiconductor chips and packages. While it is desirable to be able to shrink the pitch between conductive pillars, there are two technical challenges associated with doing so. One is that if the pitch between adjacent conductive pillars is reduced, there is the potential for solder from the solder caps on the pillars to stray to an adjacent pillar and cause a short circuit. This stray movement of solder is largely due to the fact that conventional conductive pillars are uniform diameter cylindrical structures and the sidewalls thereof attract solder that melts off of the solder caps, and that migrating solder can bridge to the adjacent pillar. Another technical issue is that if the pitch between conductive pillars is reduced by reducing the diameter of such pillars, the reduction in diameter produces a proportional increase in the stresses that are imposed upon the underlying brittle dielectric layers.

The disclosed arrangements deal with the aforementioned two technical issues by fabricating conductive pillars with an exposed shoulder that faces away from the chip. The shoulder provides not only a physical platform to catch wayward solder but also a wetting surface that will tend to attract extraneous solder and keep it from flowing down the sidewalls of the pillar where it might otherwise bridge to an adjacent pillar. In addition, by providing the shoulder, the pillar pitch can be reduced while still leaving the base portion of the pillar large enough to keep the stresses imposed upon the underlying brittle dielectric layers low enough to avoid fracture. Some of the disclosed arrangements utilize a barrier layer that provides the exposed shoulder and others utilize different structures to provide the exposed shoulder. Additional details will now be disclosed.

In accordance with one aspect of the present invention, an apparatus is provided that includes a semiconductor chip that has a side, and plural conductive pillars on the side. Each of the conductive pillars includes a pillar portion that has an exposed shoulder facing away from the semiconductor chip. The shoulder provides a wetting surface to attract melted solder. The pillar portion has a first lateral dimension at the shoulder. A solder cap is positioned on the pillar portion. The solder cap has a second lateral dimension smaller than the first lateral dimension.

In accordance with another aspect of the present invention, an apparatus is provided that includes a package substrate that has conductor structures. A semiconductor chip is mounted on the package substrate. The semiconductor chip has plural conductive pillars electrically connected to the conductor structures. Each of the conductive pillars includes a pillar portion that has an exposed shoulder facing away from the semiconductor chip. The shoulder provides a wetting surface to attract melted solder. The pillar portion has a first lateral dimension at the shoulder. A solder cap is positioned on the pillar portion. The solder cap has a second lateral dimension smaller than the first lateral dimension.

In accordance with another aspect of the present invention, a method of manufacturing is provided that includes fabricating plural conductive pillars on a side of a semiconductor chip. Each of the conductive pillars includes a pillar portion that has an exposed shoulder facing away from the semiconductor chip. The shoulder provides a wetting surface to attract melted solder. The pillar portion has a first lateral dimension at the shoulder. A solder cap is placed on each of the pillar portions. Each of the solder caps has a second lateral dimension smaller than the first lateral dimension.

In the drawings described below, reference numerals are generally repeated where identical elements appear in more than one figure. Turning now to the drawings, and in particular to FIG. 1, therein is shown a pictorial view of an exemplary embodiment of a semiconductor chip device 10 that includes a semiconductor chip 15 that can be mounted on a circuit board 20, which can be a system board, circuit card, a semiconductor chip package substrate or otherwise. The semiconductor chip 15 includes a side 22. When mounted, the side 22 of the chip 15 faces the circuit board 20. In this illustrative embodiment, and to illustrate certain features, the semiconductor chip 15 is shown detached and flipped over from its mounting position on the circuit board 20. The semiconductor chip 15 includes multiple conductive pillars, two of which are labeled 23 and 25, respectively, which are fabricated on the side 22 and designed to metallurgically bond with a corresponding array of conductor structures 30 on the circuit board 20. While only a few conductive pillars 23 and 25 are depicted, it should be understood that the conductive pillars 23 and 25 can numbers in the hundreds or thousands. The conductive pillars 23 and 25 are fabricated with some pitch P. The conductor structures can be solder bumps, pre-solders or others.

Figure 2:
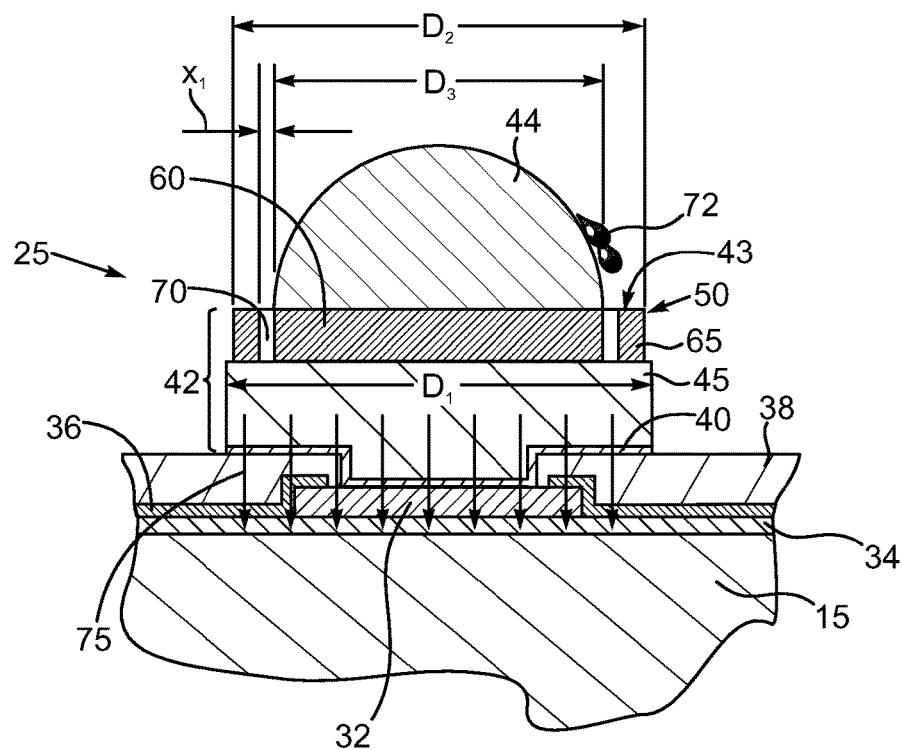
FIG. 2 is a sectional view of FIG. 1 taken at section 2-2.

Additional details of the conductive pillars 23 and 25, and those not numbered, can be understood by referring now to FIG. 2, which is a sectional view of FIG. 1 taken at section 2-2. Before turning to FIG. 2 in earnest, it should be noted that section 2-2 passes through a portion of the semiconductor chip 15 that includes one of the conductive pillars 25. The following discussion of the depicted conductive pillar 25 will be illustrative of the other conductive pillars 23 and others not numbered. For simplicity of illustration, the full depth of the semiconductor chip 15 is not depicted and the features thereof are not drawn to scale. The conductive pillar 25 is designed to provide an electrical connection between the circuit board 20 and an underlying pad 32 of the semiconductor chip 15. Before turning to additional description of the conductive pillar 25, additional features of the semiconductor chip 15 will be described. The skilled artisan will appreciate that the pad 32 may be part of a topmost layer of interconnect metallization and may be connected to various other electrical structures both laterally and vertically that form up an interconnect system for the semiconductor chip 15. In addition, the skilled artisan will appreciate that somewhere within the confines of the semiconductor chip 15 an active device region with multitudes of integrated circuit elements such as transistors, resistors and others is positioned. The conductor pad 32 can be composed of aluminum, copper, gold, platinum, silver, palladium or the like. The pad 32 is fabricated on an underlying low-K or extremely low-K (ELK) dielectric layer 34, which is designed to reduce parasitics. Optionally, another dielectric layer composed (not shown) of SiOx (thermal or CVD) or other glass or dielectric material can be fabricated between the pad 32 and the ELK layer 34 in this arrangement and the disclosed alternatives. The ELK dielectric layer 34 can be composed of, for example, porous carbon doped oxides (p-SiCOH), nano porous organosilicate and black diamond films with a K of less than about 2.7. A passivation layer 36 is fabricated over the ELK dielectric layer 34 and the conductor pad 32. The passivation layer 36 is designed to protect the conductor pad 32 from physical damage and contamination prior to the manufacture of the conductive pillar 25. Exemplary materials include silicon oxides, silicon nitride, polyimide, laminates of these or the like. A polymer layer 38 is fabricated over the passivation layer 36 and the conductor pad 32. The polymer layer 38 is designed as a stress buffer and can be composed of polyimide, benzocyclobutene, polybenzoxazoles or the like. The passivation layer 36 and the polymer layer 38 are fabricated with respective openings (not labeled) leading to the conductor pad 32.

Attention is turned again to the conductive pillar 25. The conductive pillar 25 includes a pillar portion 42 with an exposed shoulder 43 that faces away from the semiconductor chip 15 and a solder cap 44 positioned on the pillar portion 42. The pillar portion 42 includes an underbump metallization (UBM) seed layer 40, which is in ohmic contact with the underlying conductor pad 32, a pillar base portion 45 formed on the UBM seed layer 40, and a pillar barrier layer 50 formed on the pillar base portion 45. Here, the solder cap 44 is positioned on the pillar barrier layer 50. In this illustrative arrangement, the pillar barrier layer 50 consists of two components, a central portion 60 upon which the solder cap 44 is bonded and a peripheral ring portion 65 that surrounds the central portion 60 and is separated therefrom by a narrow gap 70, which has some dimension $x_1$. The ring portion 65 provides the exposed shoulder 43 in this illustrative arrangement. The provision of the ring portion 65 of the barrier layer 50 and the gap 70 and shoulder 43 defined thereby is to provide a mechanism to inhibit the lateral flow of melted solder 72 of the solder cap 44 when it is in a liquidus phase. If there is excessive solder 72 of the solder cap 44, the gap 70 and the ring portion 65 will have a tendency to attract that melted solder 72 into the gap 70 and prevent it from flowing off of the pillar portion 45 where it could potentially short to an adjacent conductive pillar 23.

Together, the UBM seed layer 40, the pillar base portion 45 and the pillar barrier layer 50 make up a UBM for the solder cap 44. The UBM is designed to satisfy a few important objectives, namely, to establish a conductive interface with an underlying conductor structure, in this case the conductor pad 32, to bond as necessary with underlying or surrounding dielectrics, such as the passivation layer 36 and the polymer layer 38, all while providing a barrier to the diffusion of solder constituents into underlying conductor structures (and vice versa), which might otherwise degrade those conductor structures, and of course, attract wayward solder 72 via the shoulder 43. In this illustrative embodiment, the UBM seed layer 40 can consist of an adhesion material, such as sputtered Ti, Ti/W, Ta, $Ta_2O_5$, Cu or the like. The UBM seed layer 40 will serve as a plating seed layer during formation of the pillar base portion 45. The pillar base portion 45 can consist of copper, silver, gold, platinum, palladium, laminates of these or the like, and the barrier can consist of nickel, nickel-vanadium or other suitable diffusion and electromigration barrier materials. The pillar barrier layer 50 can consist of nickel, nickel-vanadium or like materials suitable for diffusion and electromigration barriers. The solder cap 44 can be constructed of various types of solders, such as tin-silver, tin-silver-copper other lead-free solders. Stencil, plating, pick and place or other techniques followed by a suitable reflow can be used to fabricate the solder cap 44.

Figure 3:
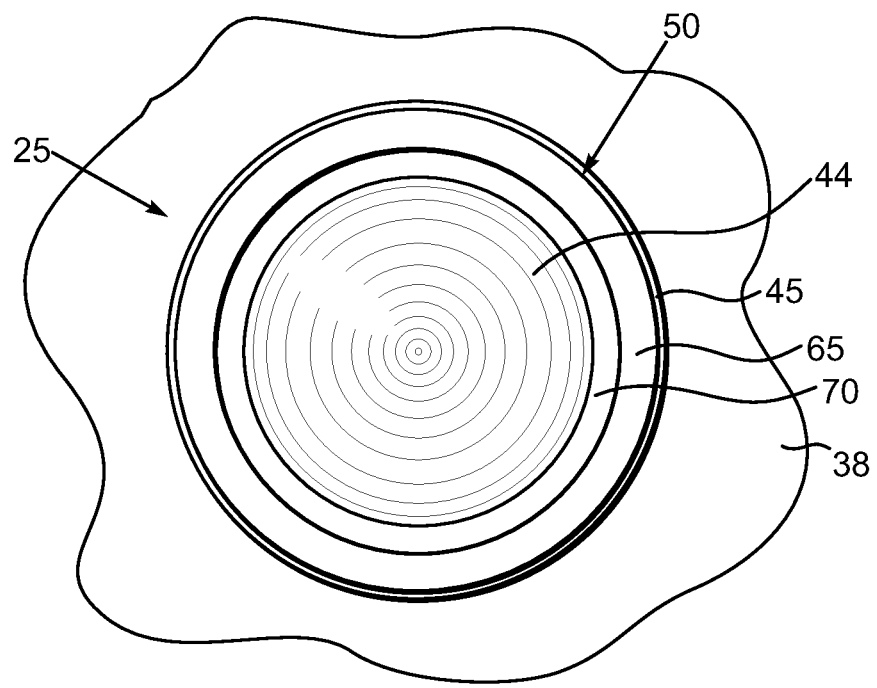
FIG. 3 is a plan view of the exemplary conductive pillar depicted in FIG. 2.
Figure 4:
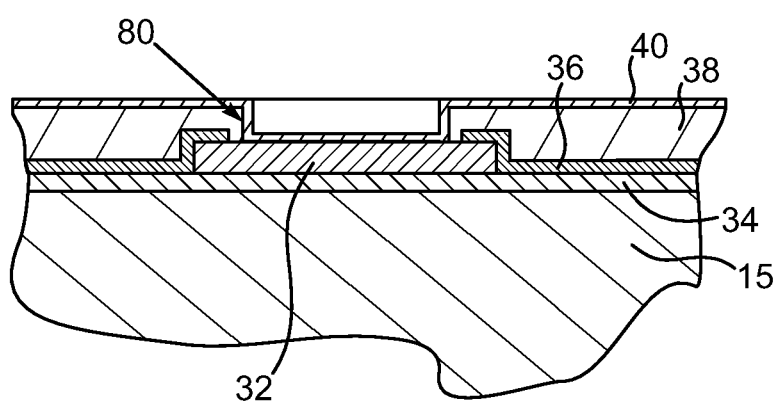
FIG. 4 is a sectional view depicting initial processing of a semiconductor chip to establish an exemplary conductive pillar.

Additional details of the conductive pillar 25 can be understood by referring now also to FIG. 3, which is a plan view of the conductive pillar 25 depicted in FIGS. 1 and 2. As noted above in conjunction with the discussion of FIG. 2, the barrier layer includes a central portion 60 which is visible in FIG. 2 but is obscured in FIG. 3 by the overlying solder cap 44. However, the pillar barrier layer 50 includes the ring portion 65 separated from the underlying and not visible central portion to define the aforementioned gap 70. It should be understood that while the conductive pillar 25 depicted in FIGS. 1 and 2 is generally circular in footprint, other shapes such as oval, square, rectangular or some other polygon shape could be used as well. Note that the underlying polymer layer 38 is visible as surrounding the pillar base portion 45.

Referring again to FIG. 2, in this illustrative arrangement, the pillar base portion 45 can be constructed with some lateral dimension $D_1$ and the ring portion 65 can be constructed with some lateral dimension $D_2$, which is slightly smaller than the lateral dimension $D_1$ of the underlying pillar base portion 45. The term "lateral dimension" can be a diameter for spherical or cylindrical structures or a width for non-spherical or non-cylindrical structures. Optionally, $D_1$ and $D_2$ can be approximately the same if desired. It is desirable for the lateral dimension $D_1$ of the pillar base portion 45 to be sufficiently large so that the area of the pillar base portion 45 is large enough to adequately spread the stresses 75 imposed on the underlying ELK dielectric layer 34. Such stresses 75 can be due to thermal cycling, assembly-die attach or other causes. As the dimension $D_1$ is reduced, the area of the pillar base portion 45 is reduced proportionally, but the stresses 75 on the ELK dielectric layer 34 will increase even if the forces conveyed by the pillar base portion 45 are not increased. Typical low-K and ELK materials are brittle. Accordingly, $D_1$ is preferably kept at sizes that will not damage the ELK dielectric layer 34. But the pitch P between adjacent pillars, e.g., pillars 23 and 25, that is typically used for conventional pillar arrays can be reduced for tighter packing while the gap 70 and the ring portion 65 guard against wayward solder 72. The central portion 60 of the pillar barrier layer 50 can be constructed with some lateral dimension $D_3$ that is smaller than $D_2$ to yield the gap 70 with width $x_1$. The post-reflow lateral dimension of the solder cap 44 is preferably the same as the central portion 60, namely $D_3$. But note that it is desirable for the solder cap 44 to have a lateral dimension $D_3$ that is smaller than the lateral dimension $D_2$ at the shoulder 43. This is to reduce the potential for solder to bleed laterally to an adjacent pillar, such as the pillar 23.

An exemplary method for fabricating the conductive pillar 25 can be understood by referring now to FIGS. 4, 5, 6, 7, 8, 9, 10, 11 and 12. Attention is turned first to FIG. 4, which is a sectional view depicting the portion of the semiconductor chip 15 where the conductive pillar 25 will be fabricated. At this point, the semiconductor chip 15 has undergone a multitude of processing steps that are well known in order to establish the ELK dielectric layer 34, the passivation layer 36, the polymer layer 38 and the conductor pad 32. For example, chemical vapor deposition can be used for the ELK dielectric layer 34 and the passivation layer 36, spin coating can be used for the polymer layer 38 followed by suitable baking, and sputtering, plating or the like can be used for the conductor pad 32 in additive or substractive processes. A suitable opening 80 is formed in the polymer layer 38 to expose a portion of the conductor pad 32. The opening 80 can be formed by exposure and development of the polymer layer 38 if infused with photoactive compounds or by etching or laser ablation. After the opening 80 is established, the UBM seed layer 40 is established by well-known sputtering techniques and using the materials described above. The UBM seed layer 40 fills the opening 80 and establishes ohmic contact with the underlying pad 32 and is blanket deposited over the exposed portions of the polymer layer 38.

Figure 5:
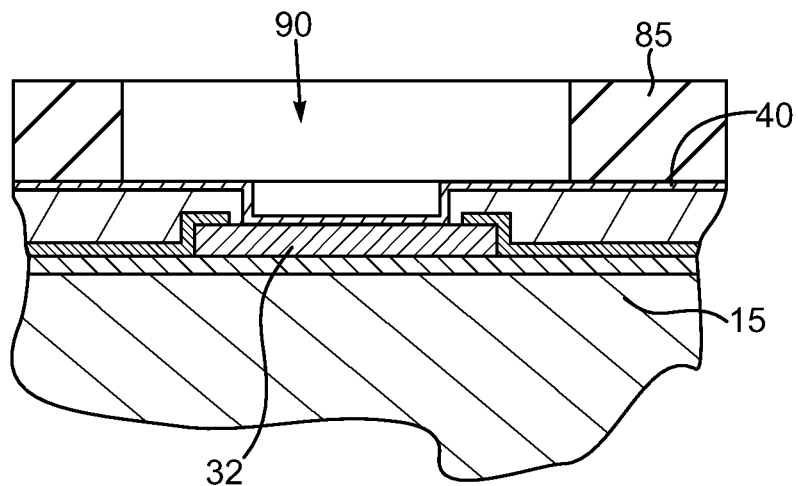
FIG. 5 is a sectional view like FIG. 4, but depicting additional processing to fabricate the exemplary conductive pillar.

The fabrication of the pillar base portion 45 will now be described. As shown in FIG. 5, a suitable photoresist mask 85 is applied over the UBM seed layer 40 using well-known spin coating and baking techniques and is photolithographically patterned to establish an opening 90 that exposes a portion of the UBM seed layer 40 over the conductor pad 32 and where the pillar base portion 45 (see FIG. 2) of the pillar portion 42 of the conductive pillar 25 will eventually be fabricated. It should be understood that the semiconductor chip 15 could be part of some larger semiconductor workpiece, such as a wafer, and the process steps described herein can be done on a wafer level basis.

Figure 6:
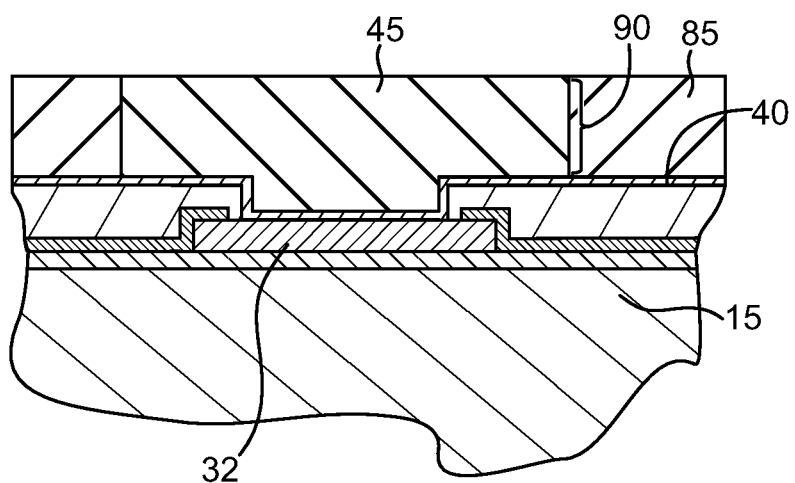
FIG. 6 is a sectional view like FIG. 5, but depicting additional processing to fabricate the exemplary conductive pillar.

Next and as shown in FIG. 6, the semiconductor chip 15 is subjected to a suitable plating process to establish the pillar base portion 45. This can be a biased plating process using the materials described elsewhere herein and a voltage applied to both the conductor pad 32 and the UBM seed layer 40. The pillar base portion 45 plates into contact with the exposed portion of the UBM seed layer 40 and generally fills the opening 90.

Figure 7:
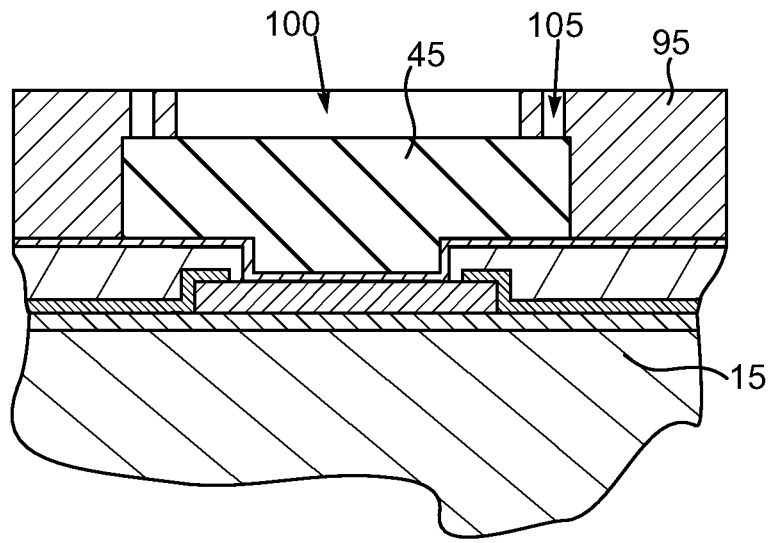
FIG. 7 is a sectional view like FIG. 6, but depicting additional processing to fabricate the exemplary conductive pillar.

The fabrication of the pillar barrier layer 50 will now be described. As shown in FIG. 7, the photoresist mask 85 depicted in FIG. 6 is stripped from the semiconductor chip 15 using well-known ashing, solvent stripping or combinations of the two and another photoresist mask 95 is applied over the UBM seed layer 40 and the pillar base portion 45. The photoresist mask 95 is applied using the same techniques described above in conjunction with the photomask 85 and is appropriately patterned with a central opening 100 over the pillar base portion 45, which is designed to facilitate the subsequent deposition of the central portion 60 of the pillar barrier layer 50 (see FIG. 2), and an annular opening 105 also over the pillar base portion 45, which is designed to facilitate the subsequent deposition of the ring portion 65 of the pillar barrier layer 50.

Figure 8:
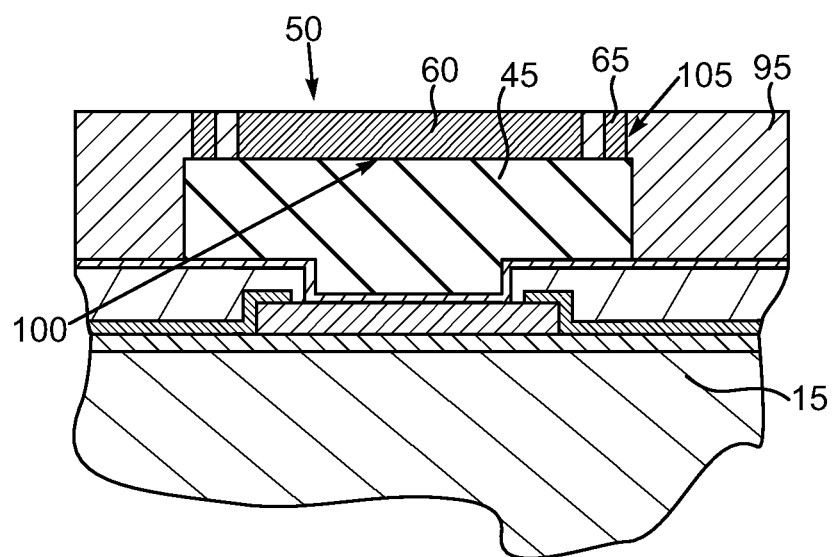
FIG. 8 is a sectional view like FIG. 7, but depicting additional processing to fabricate the exemplary conductive pillar.

Next and as shown in FIG. 8, the semiconductor chip 15 is subjected to a suitable plating process to apply the pillar barrier layer 50, which includes the aforementioned central portion 60 plated in the central opening 100 of the photoresist mask 95 and the ring portion 65 plated in the annular opening 105 also of the photoresist mask 95.

Figure 9:
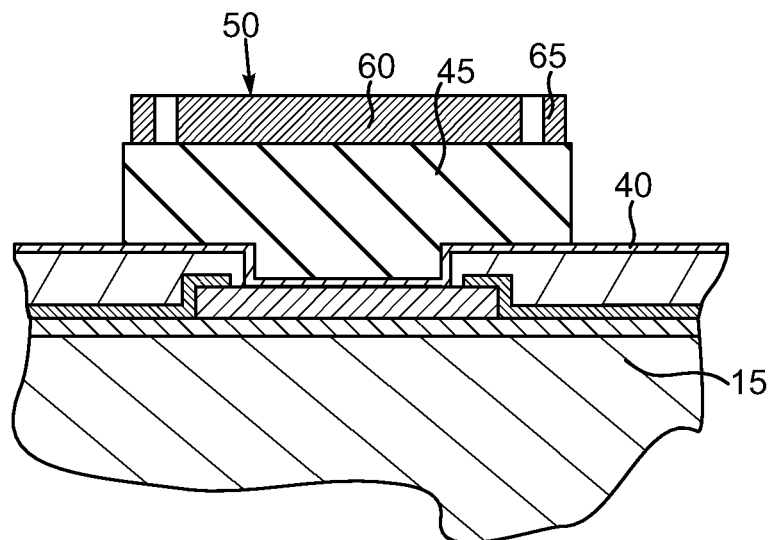
FIG. 9 is a sectional view like FIG. 8, but depicting additional processing to fabricate the exemplary conductive pillar.

Next and as shown in FIG. 9, the photomask 95 depicted in FIG. 8 is stripped from the semiconductor chip 15 using the techniques disclosed elsewhere herein to expose the central portion 60 and the ring portion 65 of the pillar barrier layer 50 and the pillar base portion 45. In addition, portions of the UBM seed layer 40 lateral to the pillar base portion 45 is exposed as well by the mask stripping.

Figure 10:
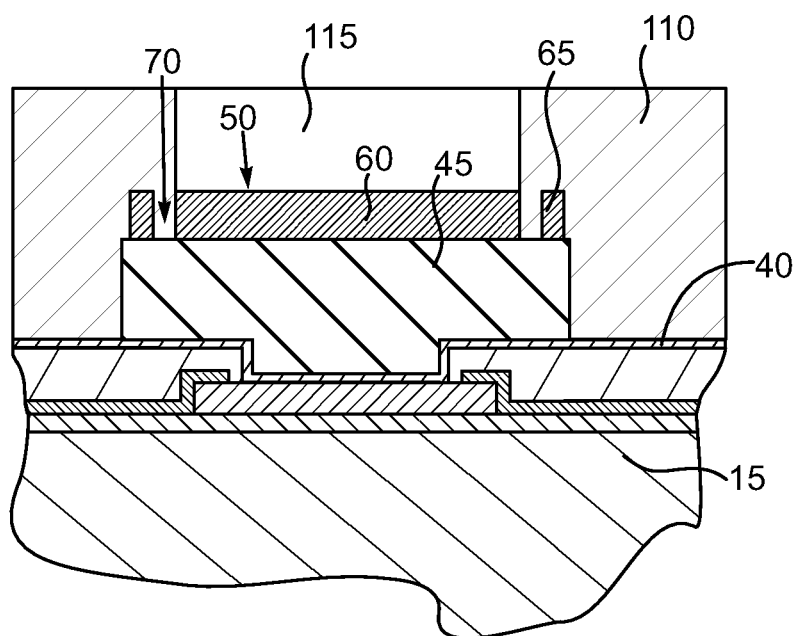
FIG. 10 is a sectional view like FIG. 9, but depicting additional processing to fabricate the exemplary conductive pillar.

The fabrication of the solder cap 44 will now be described. As shown in FIG. 10, another photoresist mask 110 is applied over the otherwise exposed portions of the UBM seed layer 40, and the pillar barrier layer 50 and the pillar base portion 45 on the semiconductor chip 15 and subjected to photolithography to pattern an opening 115 that is approximately or substantially the same lateral dimension or diameter as the central portion 60 of the pillar barrier layer 50. Note that the mask 110 covers the annular gap 70 between the central portion 60 and the ring portion 65.

Figure 11:
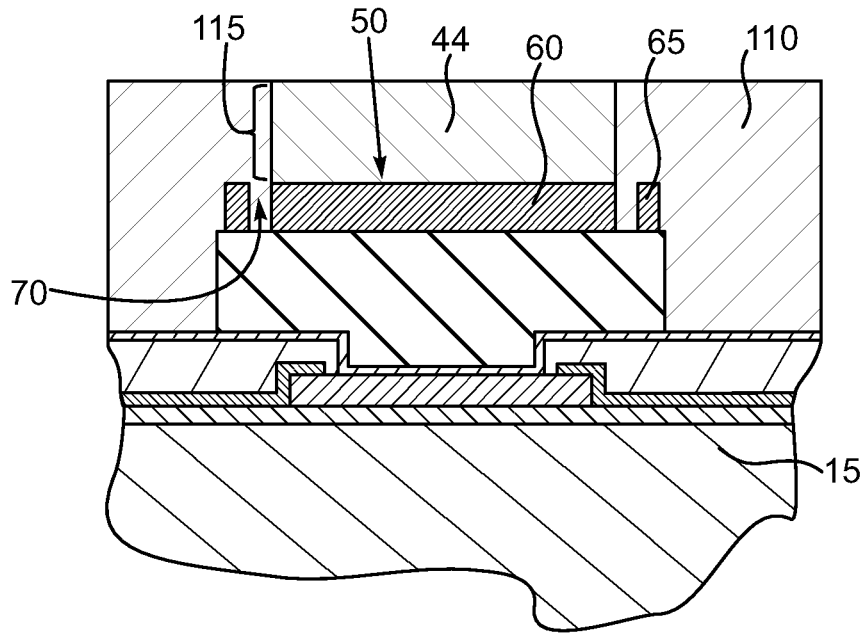
FIG. 11 is a sectional view like FIG. 10, but depicting additional processing to fabricate the exemplary conductive pillar.

Next and as shown in FIG. 11, the semiconductor chip 15 is subjected to a suitable plating process using the materials described elsewhere herein to apply the solder cap 44 in the mask opening 115 and on the central portion 60 of the pillar barrier layer 50 with the photoresist mask 110 covering the aforementioned gap 70 between the central portion 60 and the ring portion 65. Well-known biased or unbiased plating processing can be used.

Figure 12:
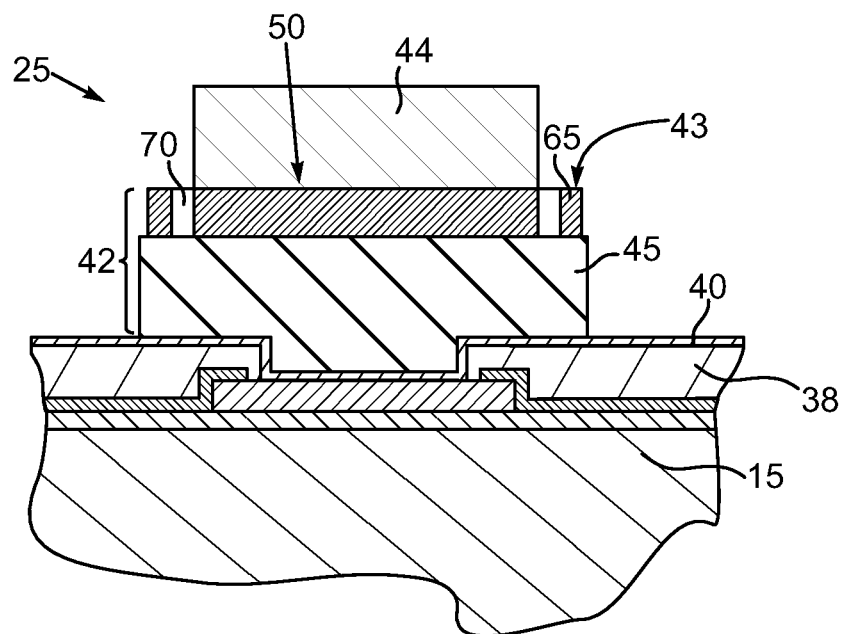
FIG. 12 is a sectional view like FIG. 11, but depicting additional processing to fabricate the exemplary conductive pillar.

Next and as shown in FIG. 12, the photoresist mask 110 depicted in FIG. 11 is stripped from the semiconductor chip 15 to expose the pillar base portion 45, the ring portion 65 and the gap 70 of the pillar barrier layer 50 and the solder cap 44. At this point, the otherwise exposed portions of the UBM seed layer 40 can be stripped from the polymer layer 38 using well-known etch techniques and a reflow process performed to temporarily melt the solder cap 44 of the conductive pillar 25 and yield the post-reflow shape depicted in FIG. 2. The shoulder 43 of the pillar portion 42 is exposed and functions as described above.

Figure 13:
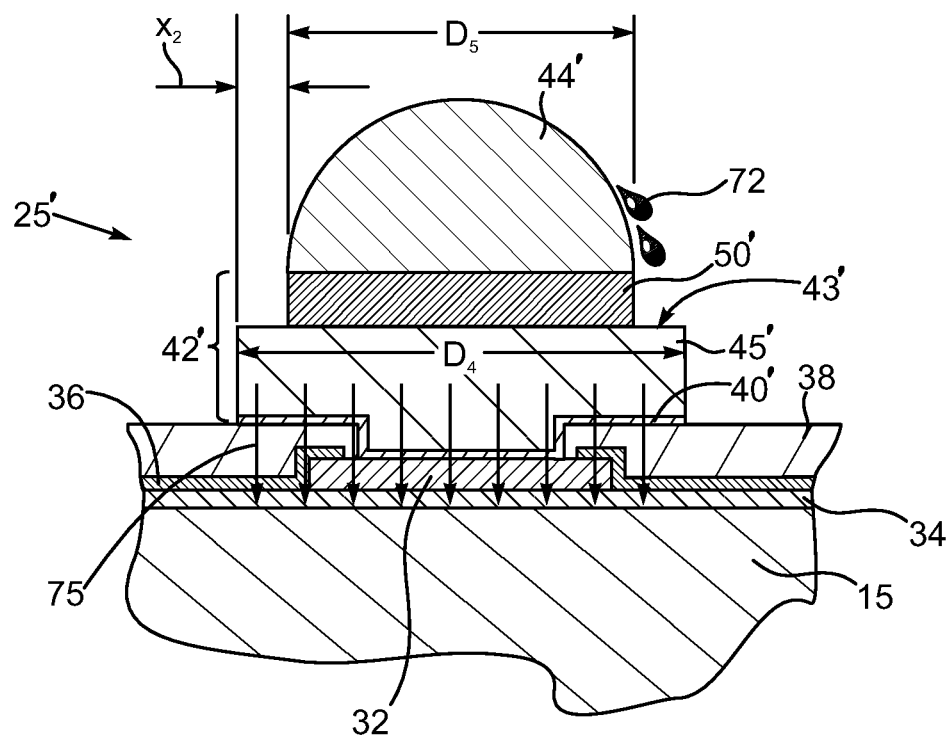
FIG. 13 is a sectional view like FIG. 2, but depicting an alternate exemplary arrangement of a semiconductor chip and conductive pillar.

An alternate exemplary arrangement of a conductive pillar 25' can be understood by referring now to FIG. 13, which is a sectional view like FIG. 2. This alternate exemplary arrangement of a conductive pillar 25' is, like the other conductive pillar 25 described above, designed to provide an I/O to the underlying conductor pad 32. This arrangement of the semiconductor chip 15 similarly includes the aforementioned ELK dielectric layer 34, the passivation layer 36 and the polymer layer 38. This illustrative arrangement of the conductive pillar 25' includes a pillar portion 42' with an exposed shoulder 43' that faces away from the semiconductor chip 15 and a solder cap 44' positioned on the pillar portion 42'. The pillar portion 42' includes a UBM seed layer 40', a pillar base portion 45' fabricated on the UBM seed layer 40' and a pillar barrier layer 50' fabricated on the pillar base portion 45'. The UBM seed layer 40' can be configured substantially identically to the UBM seed layer 40 described elsewhere herein. The pillar base portion 45' is advantageously fabricated with some lateral dimension $D_4$. The pillar base portion 45' can be constructed of the same types of materials disclosed elsewhere herein for the pillar base portion 45. The pillar barrier layer 50' is fabricated on the pillar base portion 45', but with a lateral dimension $D_5$ that is smaller than the lateral dimension $D_4$ so as to create the exposed shoulder 43' with a width $x_2$ defined by $(D_4-D_5)/2$. The solder cap 44' is fabricated on the pillar barrier layer 50' also with approximately the same lateral dimension $D_5$. The shoulder 43' established by fabricating the pillar barrier layer 50' with a smaller lateral dimension $D_5$ than the lateral dimension $D_4$ of the pillar base portion 45' is designed to provide an area upon which liquidus phase solder 72 that might otherwise spill over to an adjacent conductive pillar can land and potentially metallurgically adhere without necessarily shorting the adjacent conductive pillars. But note that it is desirable for the solder cap 44' to have a lateral dimension $D_5$ that is smaller than the lateral dimension $D_4$ at the shoulder 43'. This is to reduce the potential for solder to bleed laterally to an adjacent pillar.

As with the other disclosed arrangements, it is preferable to maintain stresses imposed by the conductive pillar 25' on the ELK dielectric layer 34 low enough to avoid fracturing. Therefore, it is desirable for the lateral dimension $D_4$ of the pillar base portion 45' to be sufficiently large to adequately spread the stresses 75 imposed on the underlying ELK 34 layer. As noted above, such stresses 75 can be due to thermal cycling, assembly-die attach or other causes. As the dimension $D_4$ is reduced, the stresses 75 on the ELK dielectric layer 34 tend to increase. Accordingly, $D_4$ is preferably kept at sizes that will not damage the ELK dielectric layer 34. But the pitch P between adjacent pillars, e.g., the pillar 25' and an adjacent pillar (not shown in FIG. 13) can be reduced for tighter packing while the shoulder 43' guard against wayward solder 72.

An exemplary method for fabricating the alternate conductive pillar 25' depicted in FIG. 13 can be understood by referring now to FIGS. 14, 15, 16 and 17. Attention is turned first to FIG. 14, which is a sectional view like FIG. 6. It should be understood that the conductor pad 32, the ELK dielectric layer 34, the passivation layer 36, the polymer layer 38 and the UBM seed layer 40' can be fabricated using the techniques disclosed above in conjunction with FIGS. 4, 5 and 6 to reach the point depicted in FIG. 14. Indeed, a photoresist mask 130 can be applied and patterned and the pillar base portion 45' fabricated using the same techniques disclosed above for the photoresist mask 85 and the pillar base portion 45 depicted in FIG. 6. However, as noted above in conjunction with FIG. 13, the pillar base portion 45' is fabricated with some lateral dimension $D_4$.

Figure 14:
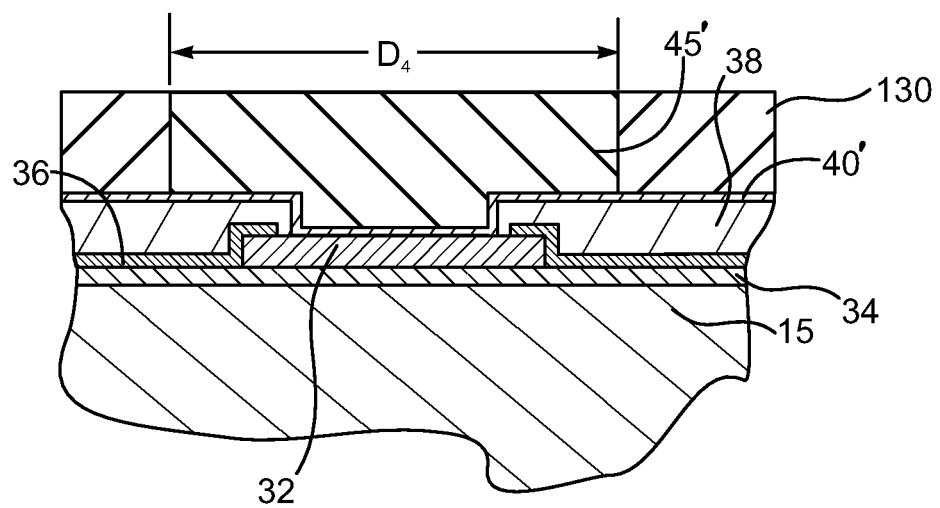
FIG. 14 is a sectional view depicting initial processing to establish the alternate exemplary conductive pillar.
Figure 15:
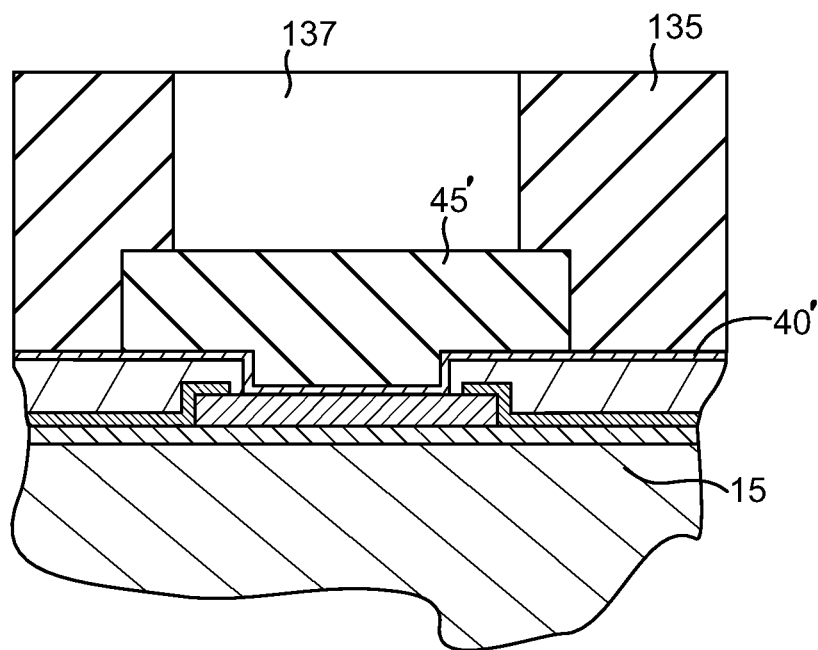
FIG. 15 is a sectional view like FIG. 14, but depicting additional processing to establish the alternate exemplary conductive pillar.

The fabrication of the pillar barrier layer 50' and the solder cap 44' will now be described. As shown in FIG. 15, the photoresist mask 130 depicted in FIG. 14 is stripped from the semiconductor chip 15 using well-known techniques disclosed elsewhere herein and another photoresist mask 135 is applied to the exposed pillar base portion 45' and the exposed portions of the UBM seed layer 40' and patterned with a suitable opening 137 that exposes a portion of the upper surface of the pillar base portion 45'. The opening 137 preferably has the lateral dimension $D_4$ that ultimately the later formed pillar barrier layer 50' and solder cap 44' will have after fabrication.

Figure 16:
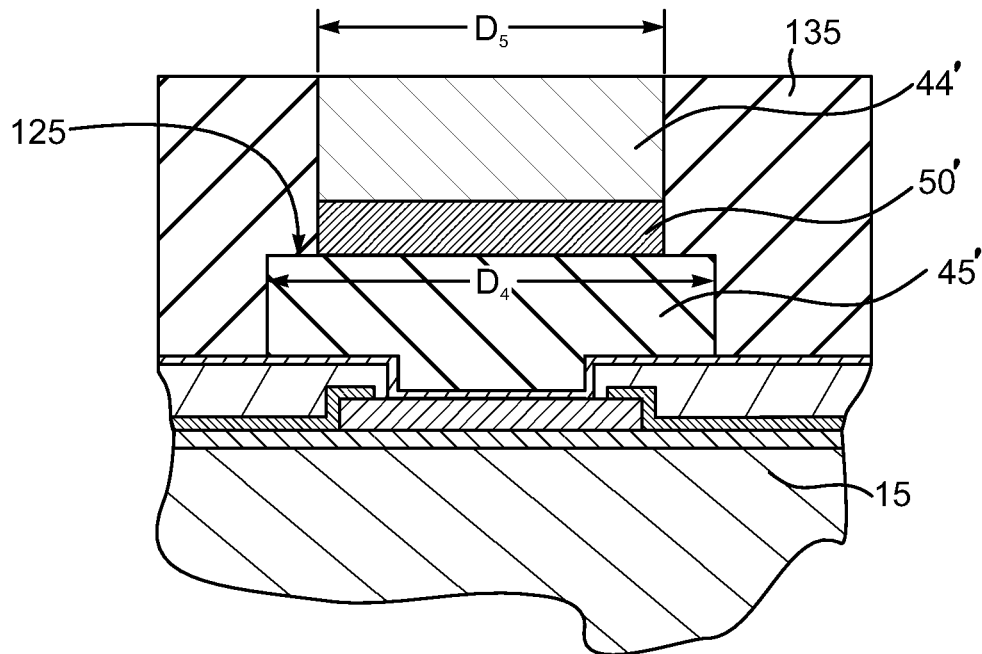
FIG. 16 is a sectional view like FIG. 15, but depicting additional processing to establish the alternate exemplary conductive pillar.

Next and as shown in FIG. 16, the semiconductor chip 15 is subjected to successive plating processes to establish the pillar barrier layer 50' and the solder cap 44' on the pillar barrier layer 50' using the photoresist mask 135 as a plating mask. The pillar barrier layer 50' is plated on and in ohmic contact with the underlying pillar base portion 45' and both the pillar barrier layer 50' and the solder cap 44' are fabricated with the desired lateral dimension $D_5$, which as noted above is less than $D_4$ so that the annular shoulder 125 is established.

Figure 17:
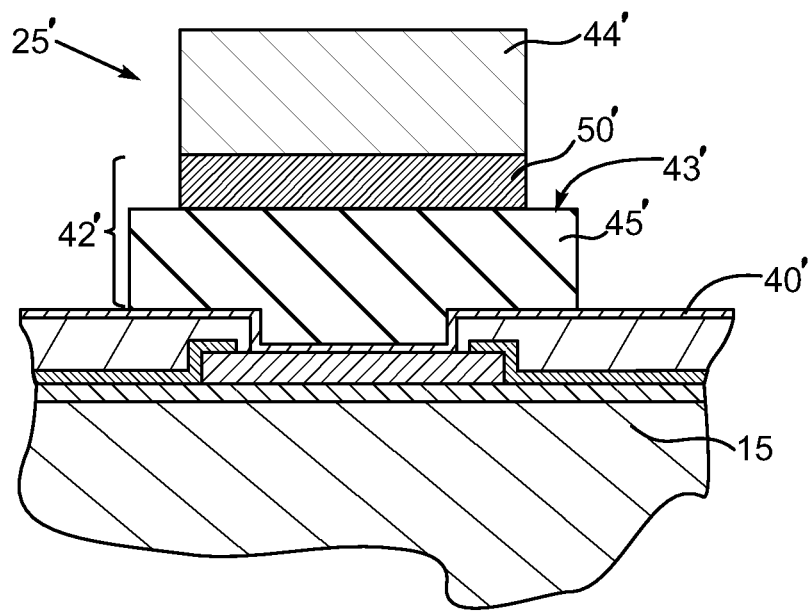
FIG. 17 is a sectional view like FIG. 16, but depicting additional processing to establish the alternate exemplary conductive pillar.

Next and as shown in FIG. 17, the photoresist mask 135 is stripped from the semiconductor chip 15 using the techniques disclosed elsewhere herein to expose the pillar base portion 45', the sides of the pillar barrier layer 50', the top and side of the solder cap 44' and a portion of the UBM seed layer 40'. In addition, the portion of the UBM seed layer 40' not covered by the pillar base portion 45' is exposed by this mask stripping step. As with the other alternate exemplary arrangement, a suitable etch process is performed at this stage to remove portions of the UBM seed layer 40' that are lateral to the pillar base portion 45' and a suitable reflow is performed to temporarily melt and change the shape of the solder cap 44' of the conductive pillar 25' to that depicted in FIG. 13. The shoulder 43' of the pillar portion 42' is exposed and functions as described above.

Figure 18:
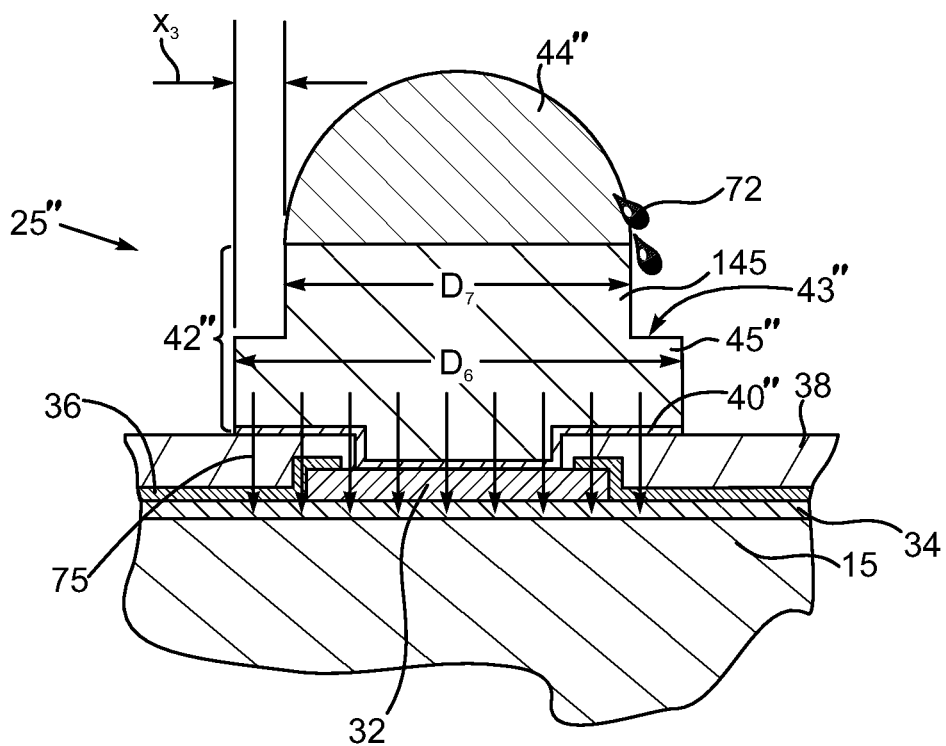
FIG. 18 is a sectional view like FIG. 2, but of another alternate exemplary arrangement of semiconductor chip with a conductive pillar.

Another alternate exemplary arrangement of a conductive pillar 25" is depicted in section in FIG. 18. FIG. 18 is a sectional view not unlike FIGS. 2 and 13. In this illustrative arrangement, the chip 15 is again fabricated with the aforementioned conductor pad 32, the ELK dielectric layer 34, the passivation layer 36 and the polymer layer 38. This illustrative arrangement of the conductive pillar 25" includes a pillar portion 42" with an exposed shoulder 43" that faces away from the semiconductor chip 15 and a solder cap 44" positioned on the pillar portion 42". The pillar portion 42" includes a UBM seed layer 40" in ohmic contact with the conductor pad 32, a pillar base portion 45" fabricated on the UBM seed layer 40" and a pillar pedestal 145 that is contiguous with the pillar base portion 45" and projects away from the semiconductor chip 15. The UBM seed layer 40" is fabricated in ohmic contact with the pad 32 and portions thereof over the polymer layer 38 as described above in conjunction with the UBM seed layers 40 and 40'. The pillar base portion 45" is fabricated with some lateral dimension $D_6$ but the pillar pedestal 145 is fabricated with a lateral dimension $D_7$ that is smaller than $D_6$. In this way, the pillar base portion 45" provides the exposed shoulder 43" with a width $x_3$ defined by $(D_6-D_7)/2$ that serves the same purpose as the shoulders 43 and 43' depicted in FIGS. 2 and 13, respectively, and discussed above. In addition, the solder cap 44" is fabricated on the pillar pedestal 145 and subjected to a reflow to establish therefore a lateral dimension that is $D_7$. But note that it is desirable for the solder cap 44" to have a lateral dimension $D_7$ that is smaller than the lateral dimension $D_6$ at the shoulder 43". This is to reduce the potential for solder to bleed laterally to an adjacent pillar. The same types of materials can be used for the UBM seed layer 40", the components of the pillar base portion 45" and the solder cap 44" as those discussed above in conjunction with other alternative arrangements.

As with the other disclosed arrangements, it is preferable to maintain stresses imposed by the conductive pillar 25" on the ELK dielectric layer 34 low enough to avoid fracturing. Therefore, it is desirable for the lateral dimension $D_6$ of the pillar base portion 45" to be sufficiently large to adequately spread the stresses 75 imposed on the underlying ELK 34 layer.

As noted above, such stresses 75 can be due to thermal cycling or other causes. As the dimension $D_6$ is reduced, the stresses 75 on the ELK dielectric layer 34 tend to increase. Accordingly, $D_6$ is preferably kept at sizes that will not damage the ELK dielectric layer 34. But the pitch P between adjacent pillars, e.g., the pillar 25" and an adjacent pillar (not shown in FIG. 18) can be reduced for tighter packing while the shoulder 150 guard against wayward solder 72.

An exemplary method for fabricating the alternate exemplary conductive pillar 25" can be understood by referring now to FIGS. 19, 20, 21, 22 and 23. Attention is turned first to FIG. 19, which is a sectional view like FIG. 14 of the semiconductor chip 15. It should be understood that the conductor pad 32, the ELK dielectric layer 34, the passivation layer 36, the polymer layer 38 and the UBM seed layer 40" can be fabricated using the techniques disclosed above in conjunction with FIGS. 4, 5 and 6 to reach the point depicted in FIG. 19. Indeed, a photoresist mask 155 can be applied and patterned and the pillar base portion 45" fabricated using the same techniques disclosed above for the photoresist mask 85 and the pillar base portion 45 depicted in FIG. 6. However, as noted above in conjunction with FIG. 18, the pillar base portion 45" is fabricated with some lateral dimension $D_6$. Here, the pillar base portion 45" is fabricated using well-known plating processes and the materials disclosed above, albeit here with some lateral dimension $D_6$. Indeed, the same types of process steps including the fabrication of the photo resist mask 155 and the patterning of a suitable opening therein to accommodate the plating of the pillar base portion 45" can be substantially as described above.

Figure 19:
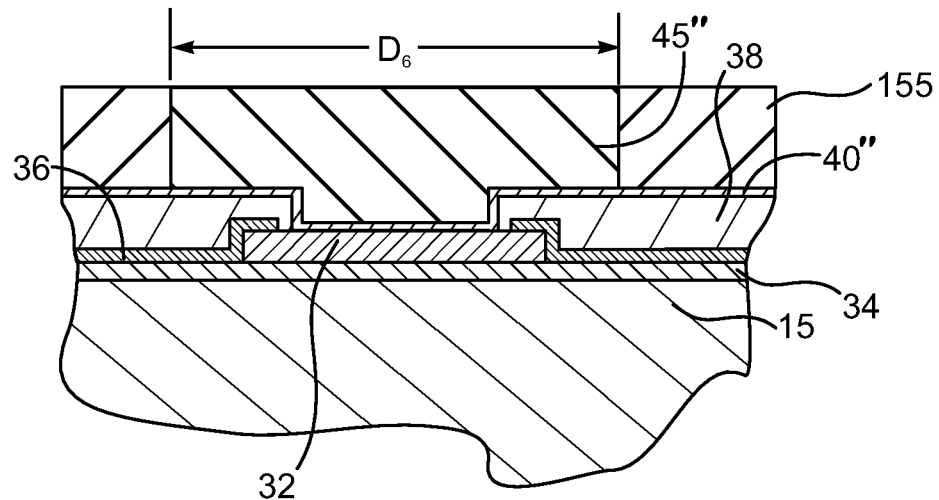
FIG. 19 is a sectional view depicting initial processing to establish the alternate exemplary conductive pillar.
Figure 20:
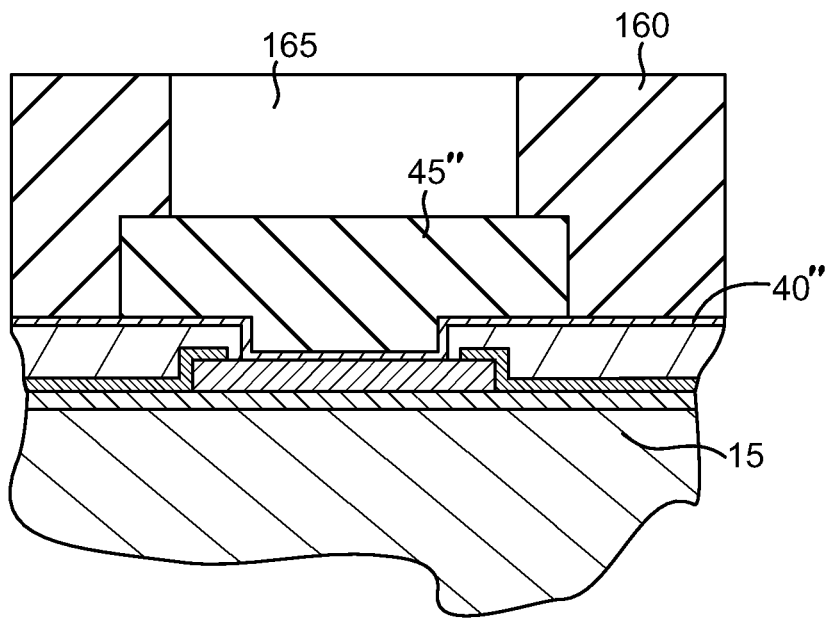
FIG. 20 is a sectional view like FIG. 19, but depicting additional processing to establish the alternate exemplary conductive pillar.

The fabrication of the pillar pedestal 145 will now be described. As shown in FIG. 20, the photoresist mask 155 depicted in FIG. 19 is stripped from the semiconductor chip 15 using the techniques disclosed elsewhere herein and another photoresist mask 160 is fabricated on the otherwise exposed portions of the UBM seed layer 40" and the pillar base portion 45". However, the mask 160 is applied with a suitable thickness patterned with a an opening 165 that exposes a portion of the upper surface of the pillar base portion 45" but with the desired lateral dimension $D_7$ of the later formed pillar pedestal 145 depicted in FIG. 18. The opening is suitably deep to accommodate subsequent plating processes to fabricate the pillar pedestal 145 and the solder cap 44" shown in FIG. 18.

Figure 21:
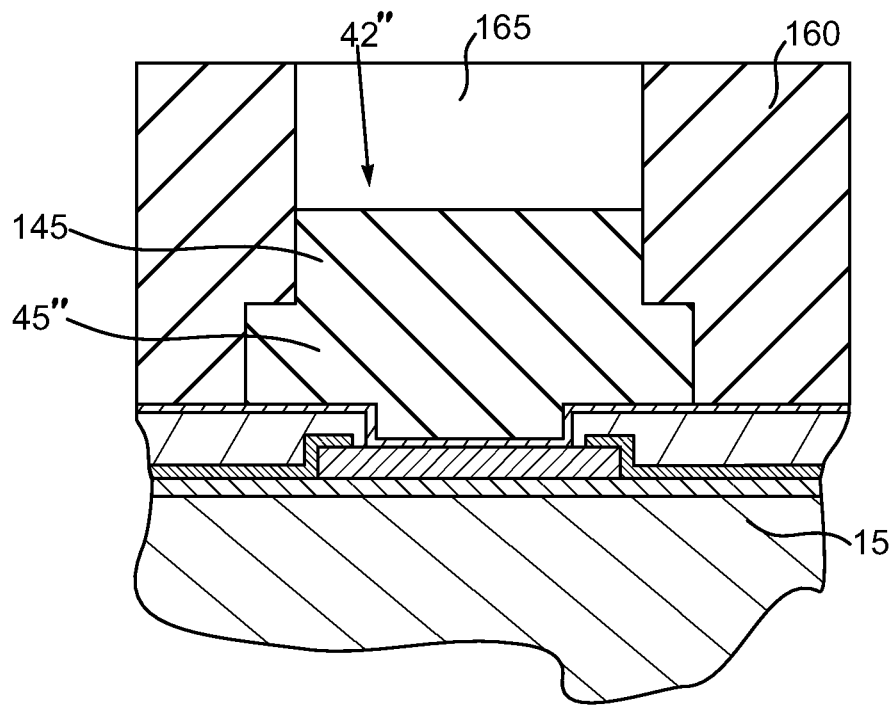
FIG. 21 is a sectional view like FIG. 20, but depicting additional processing to establish the alternate exemplary conductive pillar.

Next, and as shown in FIG. 21, the semiconductor chip 15 is subjected to a suitable plating process using the photoresist mask 160 as a plating mask to establish the pillar pedestal 145 in the opening 165 and on the pillar base portion 45". The plating process to establish the pillar base portion 45" and the pillar pedestal 145 can use the same types of techniques and materials disclosed above for the other alternate arrangements of the pillar base portions 45 and 45'. The second plating process completes the pillar portion 42".

Figure 22:
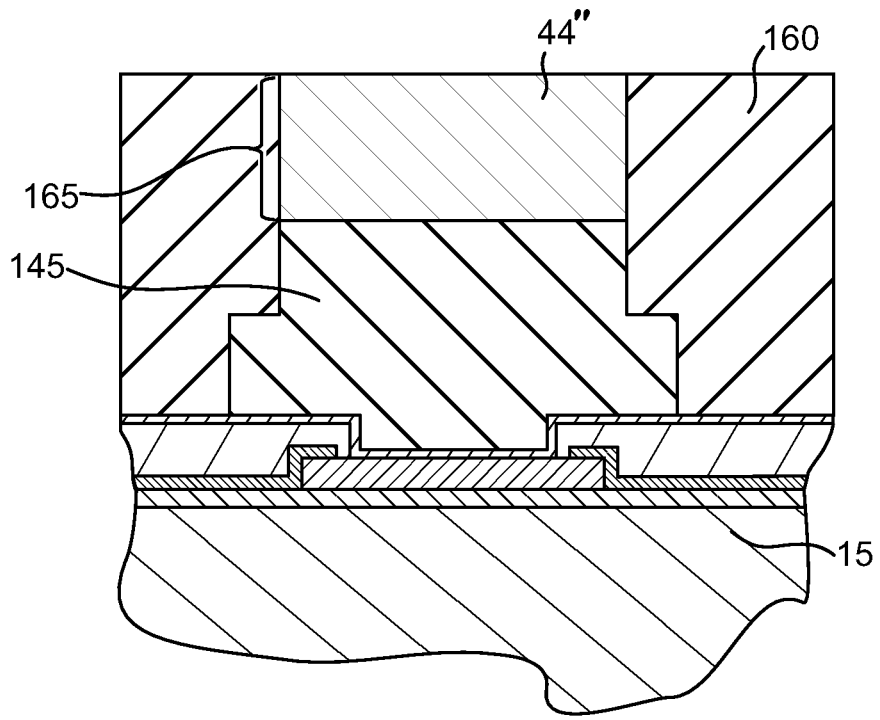
FIG. 22 is a sectional view like FIG. 21, but depicting additional processing to establish the alternate exemplary conductive pillar.

The fabrication of the solder cap 44" will now be described. As shown in FIG. 22, the semiconductor chip 15 is again subjected to a plating process to fabricate the solder cap 44" using the photoresist mask 160 as a plating mask. The solder cap 44" is established in the opening 165 and on the pillar pedestal 145 using the same types of materials and techniques described elsewhere herein.

Figure 23:
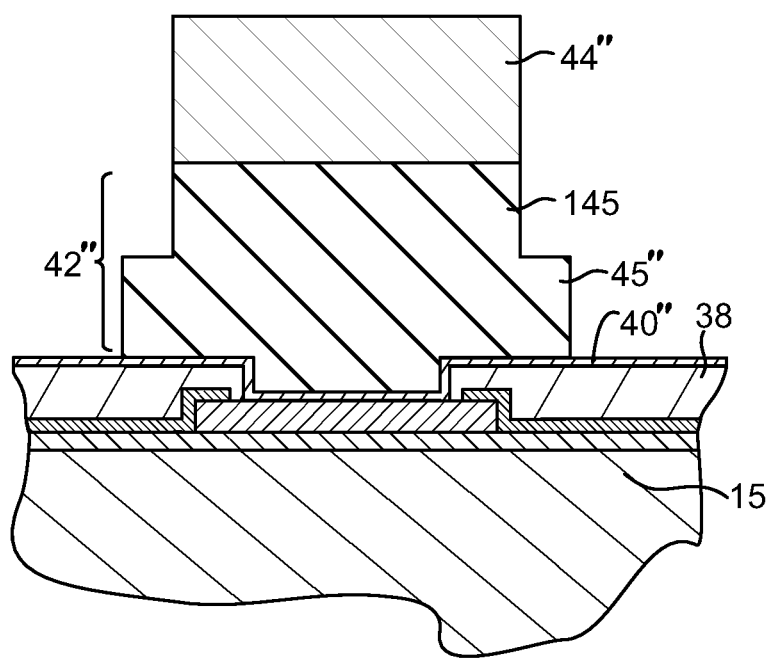
FIG. 23 is a sectional view like FIG. 22, but depicting additional processing to establish the alternate exemplary conductive pillar.

Next and as shown in FIG. 23, the photoresist mask 160 depicted in FIG. 22 is stripped from the semiconductor chip 15 using the techniques disclosed elsewhere herein to expose the top and side of the solder cap 44", the sides of the pillar base portion 45" and the pillar pedestal 145 of the pillar portion 42", and portions of the UBM seed layer 40" that are not otherwise covered by the pillar base portion 45". At this stage a suitable etch process is performed to remove the otherwise exposed portions of the UBM seed layer 40" from the polymer layer 38 and a reflow performed in order to temporarily melt and solidify and thus reshape the solder cap 44" to the shape depicted in FIG. 18.

With any of the disclosed arrangements, following the fabrication of the conductive pillars 25, 25' or 25", the semiconductor chip 15 can be flipped over and mounted on a circuit board, such as the circuit board 20, and then a suitable reflow process performed to establish metallurgical connections between the solder caps 44, 44' or 44" and whatever underlying solder structures the circuit board happens to use.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
   a semiconductor chip having a side;
   plural conductive pillars on the side, each of the conductive pillars including a pillar portion, wherein the pillar portion includes a pillar base portion and a pillar barrier layer positioned on the pillar base portion, the pillar base portion having an exposed shoulder facing away from the semiconductor chip, the shoulder providing a wetting surface to attract melted solder, the pillar base portion having a first lateral dimension at the shoulder, the pillar barrier layer including a gap configured to inhibit lateral flow of the melted solder; and
   a solder cap positioned on the pillar barrier layer, the solder cap and the pillar barrier layer having a second lateral dimension smaller than the first lateral dimension.

2. The apparatus of claim 1, wherein the pillar barrier layer comprises nickel or nickel-vanadium.

3. The apparatus of claim 2, comprising an underbump metallization (UBM) seed layer positioned beneath the pillar base portion.

4. The apparatus of claim 3, comprising a polymer layer positioned beneath the UBM seed layer.

5. The apparatus of claim 1, wherein the pillar portion comprises a pillar base portion and pillar pedestal portion projecting away from the pillar base portion, the pillar base portion having the exposed shoulder.

6. The apparatus of claim 1, wherein the side of the semiconductor chip includes a dielectric layer beneath the pillar base portion and having a dielectric constant of less than about 2.7.

7. The apparatus of claim 1, comprising a circuit board, the semiconductor chip being mounted on the circuit board.

8. An apparatus, comprising: a package substrate having conductor structures; and
   a semiconductor chip mounted on the package substrate, the semiconductor chip having plural conductive pillars electrically connected to the conductor structures, each of the conductive pillars including a pillar portion, wherein the pillar portion includes a pillar base portion and a pillar barrier layer positioned on the pillar base portion, the pillar base portion having an exposed shoulder facing away from the semiconductor chip, the shoulder providing a wetting surface to attract melted solder, the pillar base portion having a first lateral dimension at the shoulder, the pillar barrier layer including a gap configured to inhibit lateral flow of the melted solder; and
   a solder cap positioned on the pillar barrier layer, the solder cap and the pillar barrier layer having a second lateral dimension smaller than the first lateral dimension.

9. The apparatus of claim 8, wherein the pillar barrier layer comprises nickel or nickel-vanadium.

10. The apparatus of claim 9, comprising an underbump metallization (UBM) seed layer positioned beneath the pillar base portion.

11. The apparatus of claim 10, comprising a polymer layer positioned beneath the UBM seed layer.

12. The apparatus of claim 8, wherein a side of the semiconductor chip includes a dielectric layer beneath the pillar base portion and having a dielectric constant of less than about 2.7.

13. The apparatus of claim 8, wherein the conductive pillars have a circular, oval, square, rectangular or some other polygon footprint.

14. A method of manufacturing, comprising: fabricating plural conductive pillars on a side of a semiconductor chip, each of the conductive pillars including a pillar portion, wherein the pillar portion includes a pillar base portion and a pillar barrier layer positioned on the pillar base portion, the pillar base portion having an exposed shoulder facing away from the semiconductor chip, the shoulder providing a wetting surface to attract melted solder, the pillar base portion having a first lateral dimension at the shoulder, the pillar barrier layer including a gap configured to inhibit lateral flow of the melted solder; and
   placing a solder cap on each of the pillar barrier layers, each of the solder caps and the pillar barrier layers having a second lateral dimension smaller than the first lateral dimension.

15. The method of claim 14, wherein the pillar barrier layer comprises nickel or nickel-vanadium.

16. The method of claim 15, wherein the semiconductor chip further comprises an underbump metallization (UBM) seed layer positioned beneath the pillar base portion and the pillar barrier layer has a central portion and a ring portion separated from the central portion by a gap, the gap providing a space to attract the melted solder.

17. The method of claim 16, comprising a polymer layer positioned beneath the UBM seed layer.

18. The method of claim 14, wherein the pillar portion comprises a pillar base portion and pillar pedestal portion projecting away from the pillar base portion, the pillar base portion having the exposed shoulder.

19. The method of claim 18, wherein the side of the semiconductor chip includes a dielectric layer beneath the pillar base portion and having a dielectric constant of less than about 2.7.

20. The method of claim 14, comprising mounting the semiconductor chip on a circuit board.

\* \* \* \* \*